United States Patent
Izuo et al.

(10) Patent No.: US 9,521,737 B2
(45) Date of Patent: Dec. 13, 2016

(54) POWER MODULE

(71) Applicant: Mitsubishi Electric Corporation, Chiyoda-ku (JP)

(72) Inventors: Shinichi Izuo, Tokyo (JP); Masaki Taya, Tokyo (JP); Taichi Obara, Tokyo (JP); Nobuya Nishida, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 25 days.

(21) Appl. No.: 14/441,064

(22) PCT Filed: May 20, 2013

(86) PCT No.: PCT/JP2013/003182
§ 371 (c)(1),
(2) Date: May 6, 2015

(87) PCT Pub. No.: WO2014/083717
PCT Pub. Date: Jun. 5, 2014

(65) Prior Publication Data
US 2015/0289356 A1    Oct. 8, 2015

(30) Foreign Application Priority Data

Nov. 28, 2012    (JP) ................................. 2012-260002

(51) Int. Cl.
*H01L 23/40*    (2006.01)
*H05K 7/20*    (2006.01)
(Continued)

(52) U.S. Cl.
CPC ........... *H05K 1/0203* (2013.01); *H01L 23/049* (2013.01); *H01L 23/10* (2013.01);
(Continued)

(58) Field of Classification Search
CPC ....... H01L 23/40–23/4006; H01L 2924/00014; H05K 7/20409–7/418
See application file for complete search history.

(56) References Cited

U.S. PATENT DOCUMENTS

| 5,793,106 A | 8/1998 | Yasukawa et al. |
| 6,963,131 B2 * | 11/2005 | Frisch ................ H01L 23/3672 165/10 |

(Continued)

FOREIGN PATENT DOCUMENTS

| JP | 06 204366 | 7/1994 |
| JP | 06 302732 | 10/1994 |
| JP | 09 139463 | 5/1997 |
| JP | 11 274398 | 10/1999 |
| JP | 2000 299419 | 10/2000 |
| JP | 3225457 | 11/2001 |
| JP | 2006 024639 | 1/2006 |

OTHER PUBLICATIONS

International Preliminary Report on Patentability and Written Opinion issued Jun. 2, 2015 in PCT Application No. PCT/JP2013/003182 with English translation.

(Continued)

*Primary Examiner* — Robert J Hoffberg
(74) *Attorney, Agent, or Firm* — Oblon, McClelland, Maier & Neustadt, L.L.P.

(57) ABSTRACT

In a power module, a power semiconductor element is mounted on a heat dissipation substrate having a tilted part formed at an end portion thereof, a resin case is arranged so as to surround the power semiconductor element and to contact the heat dissipation substrate, and a cooling fin is arranged so as to contact a surface of the heat dissipation substrate opposite a surface of the heat dissipation substrate on which the power semiconductor element is mounted. The power module includes pressure member contacting the tilted part of the heat dissipation substrate to press the heat dissipation substrate against the cooling fin.

8 Claims, 3 Drawing Sheets

(51) Int. Cl.
*H05K 1/02* (2006.01)
*H01L 23/13* (2006.01)
*H01L 23/373* (2006.01)
*H01L 25/07* (2006.01)
*H01L 25/18* (2006.01)
*H01L 23/049* (2006.01)
*H01L 23/10* (2006.01)
*H01L 23/24* (2006.01)

(52) U.S. Cl.
CPC .............. *H01L 23/13* (2013.01); *H01L 23/24* (2013.01); *H01L 23/3735* (2013.01); *H01L 23/4006* (2013.01); *H01L 25/07* (2013.01); *H01L 25/18* (2013.01); *H05K 7/209* (2013.01); *H01L 2224/45147* (2013.01); *H01L 2224/48091* (2013.01); *H01L 2924/1305* (2013.01); *H01L 2924/13055* (2013.01); *H01L 2924/13091* (2013.01)

(56) References Cited

U.S. PATENT DOCUMENTS

| | | | | |
|---|---|---|---|---|
| 7,808,100 | B2* | 10/2010 | Bayerer | H01L 24/06 174/261 |
| 8,154,114 | B2* | 4/2012 | Bayerer | H01L 23/3735 257/700 |
| 8,637,979 | B2* | 1/2014 | Miyamoto | H01L 23/4006 257/712 |
| 9,041,196 | B2* | 5/2015 | Bayerer | H01L 23/367 257/678 |
| 2014/0374896 | A1* | 12/2014 | Nishida | H01L 21/56 257/712 |

OTHER PUBLICATIONS

International Search Report issued Aug. 13, 2013 in PCT/JP13/003182 filed May 20, 2013.

* cited by examiner

POWER MODULE

TECHNICAL FIELD

The present invention relates to an attachment structure in a power module used to form tight contact of a heat dissipation substrate on which a power semiconductor element is mounted with a cooling fin in the power module, for example.

BACKGROUND ART

In a conventional power module, a resin case and a cooling fin are fixed with a screw and a heat dissipation substrate on which a power semiconductor element is mounted is attached to the cooling fin by adopting means of pressing the heat dissipation substrate against the cooling fin with a projection provided to the resin case (see patent literature 1, for example).

PRIOR ART LITERATURES

Patent Literatures

Patent Literature 1: Publication of Japanese Patent No. 3225457 (page 2 and FIG. 1)

SUMMARY OF INVENTION

Problems to be Solved by Invention

In the conventional power module, as a result of use of the resin case for fixing the heat dissipation substrate to the cooling fin, stress resulting from screw axial force is applied to the resin case. This stress deforms the resin case. This deformation of the resin case causes a crack in resin filling in the resin case. This crack causes the problem of a failure in a breakdown voltage or fluctuation of electrical properties.

The present invention has been made to solve the aforementioned problem. The present invention is intended to provide a power module capable of avoiding the occurrence of a crack in resin filling in a resin case by suppressing deformation of the resin case to occur by fixing of a heat dissipation substrate to a cooling fin.

Means of Solving Problems

A power module of the present invention includes: a heat dissipation substrate on which a power semiconductor element is mounted, the heat dissipation substrate having a tilted part formed at an end portion thereof; a resin case contacting a surface on which the power semiconductor element is mounted; a cooling fin contacting a rear surface of the heat dissipation substrate; and pressure structure contacting the tilted part at the end portion of the heat dissipation substrate to press the heat dissipation substrate against the cooling fin.

Advantageous Effects of Invention

According to the present invention, a corner (outer periphery) of a cross section of the heat dissipation substrate is formed into the tilted part and the tilted part formed at the outer periphery of the heat dissipation substrate is pressed with the pressure structure. This suppresses deformation of the resin case acting with the corner of the outer periphery of the heat dissipation substrate as a fulcrum, so that the occurrence of a crack in resin filling in the resin case can be avoided.

DESCRIPTION OF EMBODIMENT(S)

In all the drawings referred to below for description of embodiments, structures with the same signs mean that these structures are the same or corresponding structures.

First Embodiment

Figure 1A:
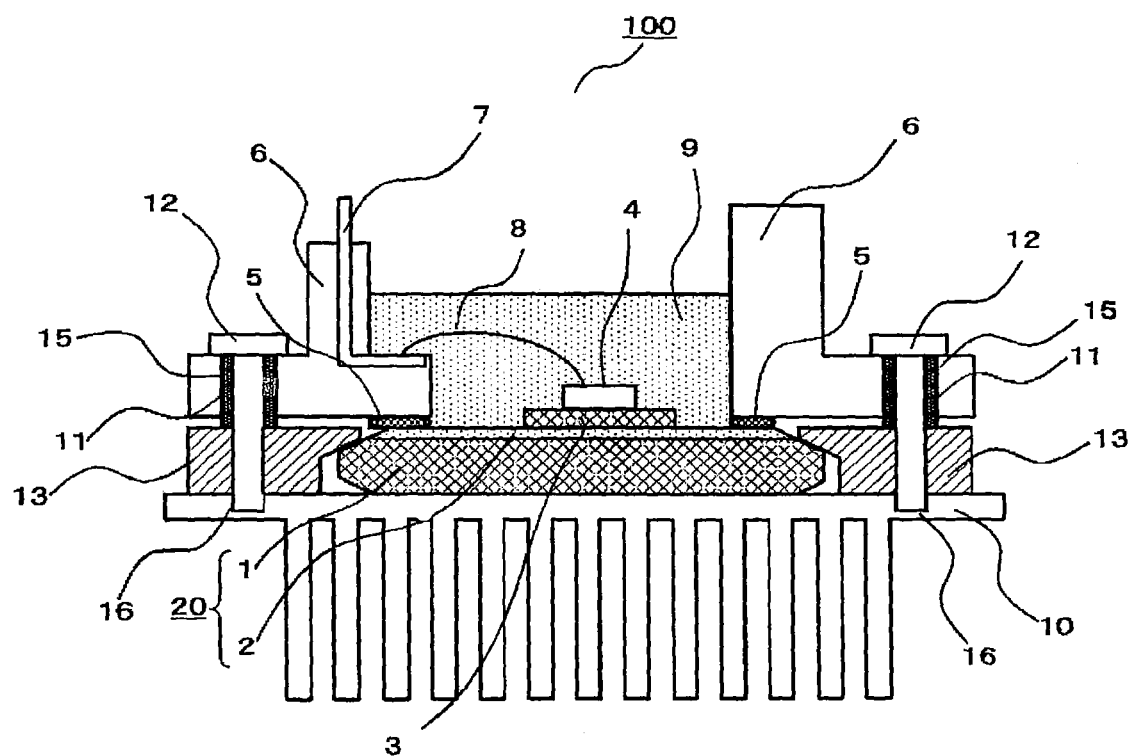
FIGS. 1A and 1B are diagrammatic views showing the cross-sectional structure of a power module of a first embodiment of the present invention.
Figure 1B:
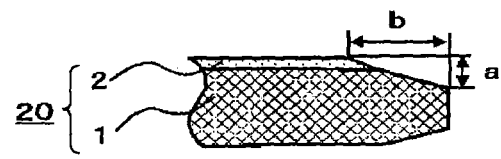

FIGS. 1A, 1B are diagrammatic views showing the cross-sectional structure of a power module of a first embodiment of the present invention. As shown in FIG. 1A, a power module 100 includes a resin case 6, a cooling fin 10, a pressure member 13 as pressure structure, and a heat dissipation substrate 20. The resin case 6 has passage holes 15 as through holes formed in an outer periphery thereof. The cooling fin 10 has screw holes 16 formed in an outer periphery thereof.

The heat dissipation substrate 20 has a metal base 1 and an insulating layer 2. A metal pattern 3 is formed on the heat dissipation substrate 20. A power semiconductor element 4 is mounted on the metal pattern 3 via solder (not shown in the drawings). The heat dissipation substrate 20 has a tilted part at one end portion thereof. The tilted part is tilted to a lower position from an inner side toward an outer periphery of the heat dissipation substrate 20.

The power semiconductor element 4 may be an IGBT (insulated-gate-bipolar-transistor) or a power MOSFET (metal-oxide-semiconductor-field-effect-transistor), for example. Alternatively, the power semiconductor element 4 may be an FWD (free-wheeling-diode).

The aforementioned respective shapes of the power semiconductor element 4 and the metal pattern 3 form an inverter circuit, for example. The power module 100 includes this inverter circuit.

Aluminum and copper, and alloys thereof are applicable to form the metal base 1 in terms of heat dissipation performance and density. It is desirable that the metal pattern 3 be made of copper or a copper alloy in terms of electric resistance and heat dissipation performance. Regarding the respective thicknesses of the metal base 1 and the metal pattern 3 in terms of productivity and economic aspect, it is desirable that the metal base 1 be from about 0.5 to about 3.0 mm and the metal pattern 3 be from about 0.1 to 0.5 mm.

It is preferable that the insulating layer 2 be made of epoxy or liquid crystal polymer filled with a filler material having high heat dissipation performance. The thickness of the insulating layer 2 is determined based on a rated voltage to be used and desired heat dissipation properties. It is desirable that this thickness be in a range from about 0.1 to about 0.3 mm.

In this way, the heat dissipation substrate 20 is formed on which the power semiconductor element 4 is mounted. The tilted part is formed at a corner (outer periphery) of each of opposite cross-sectional ends of the heat dissipation substrate 20 shown in FIG. 1. This tilted part is formed at the metal base 1 or at the metal base 1 and the insulating layer 2. A tilted part may be omitted from an end portion of the metal base 1 on a side opposite a surface of the metal base 1 on which the power semiconductor element 4 is mounted.

FIG. 1B is a diagrammatic view showing the cross-sectional structure of the outer periphery of the heat dissipation substrate 20 in an enlarged manner. The tilted part is tilted to an angle in a range from 20 to 60 degrees suitably, desirably from 30 to 45 degrees relative to a flat surface on which the power semiconductor element 4 is mounted. As shown in FIG. 1B, if a tilted surface has a tilt of 30 degrees and if a size a of the tilted surface in the thickness direction of the heat dissipation substrate 20 is 1.5 mm, for example, a width b at a tilted surface part in the direction of the flat surface is determined to be $1.5 \times \sqrt{3} = 2.6$ mm. Reserving 2 mm or more for the width b at the tilted surface part is desirable for holding the substrate reliably to counter vibration from outside, for example.

The heat dissipation substrate 20 on which the power semiconductor element 4 is mounted is fixed in the resin case 6 via adhesive 5. The resin case 6 is made of PPS (poly-phenylene-sulfide). A terminal 7 includes a main terminal and a control terminal built in the resin case 6. The terminal 7 is connected to the power semiconductor element 4 arranged inside the resin case 6. The power semiconductor element 4 is electrically connected to the outside via the terminal 7. As an example, connections are formed between the gate of an IGBT as the power semiconductor element 4 and the control terminal, between the emitter of the IGBT as the power semiconductor element 4 and the main terminal, and between the collector and the main terminal. These connections are formed using aluminum wires 8 of a diameter of 0.4 mm, for example. The aluminum wires 8 are bonded to the power semiconductor element 4 and the terminal 7 by an ultrasonic method. The aluminum wires 8 may be replaced by copper wires. The copper wires feature lower resistance than aluminum wires, so that they act effectively particularly for the power semiconductor element 4 to handle a large current.

To protect the power semiconductor element 4 and an area where the aluminum wires 8 are provided and to ensure an insulating breakdown voltage, filling resin 9 is provided in a region formed by the resin case 6 and the heat dissipation substrate 20. As an example, resin mainly containing gel or an epoxy resin is used as the filling resin 9.

The module including the heat dissipation substrate 20, the resin case 6, and the filling resin 9 arranged integrally is attached with screws 12 to the cooling fin 10. The resin case 6 is provided with the passage holes 15 for screw fastening. Bushings 11 are provided in the passage holes 15. The bushings 11 are used for fixing the resin case 6 to the cooling fin 10 reliably. This module is fixed to the cooling fin 10 by fastening the screws 12 into the screw holes 16 in the cooling fin 10 via the passage holes 15. The bushings 11 have a circular cylindrical shape. Meanwhile, the shape of the bushings 11 is not limited to a circular cylinder but it may also be a polygon as long as such a shape allows insertion of the bushings 11 in the passage holes 15. Regarding the length of the bushings 11, the bushings 11 are simply required to be greater than the depth of the passage holes 15 in the resin case 6. Alternatively, the bushings 11 may have a shape that makes the bushings 11 get caught on the resin case 6 on a side of the resin case 6 where the screws 12 are inserted.

Provision of the pressure member 13 between the bushings 11 and the cooling fin 10 makes the pressure member 13 receive compressive force resulting from screw axial force. The tilted part is formed at an end portion of the heat dissipation substrate 20 The pressure member 13 abuts on the tilted part of the metal base 1, or the tilted part formed at the metal base 1 and the insulating layer 2. The pressure member 13 has a tilted part that can contact the tilted part of the heat dissipation substrate 20. The tilted part of the pressure member 13 is formed in a part contacting the tilted part of the heat dissipation substrate 20. The thickness of the pressure member 13 is the same as or smaller by a range from about 0.1 to about 0.2 mm than that of the heat dissipation substrate 20. As a result of the aforementioned structure, the pressure member 13 produces the effect of pressing the heat dissipation substrate 20 against the cooling fin 10. After the screw fastening, the bushings 11 project from the passage holes 15 toward the cooling fin 10 and the adhesive 5 and the bushings 11 together form gaps between the resin case 6 and the pressure member 13. It is desirable that the pressure member 13 be made of metal. Meanwhile, the material for the pressure member 13 is not limited to metal but it is simply required to be resistant to temporal change.

In a structure without a tilted part at a cross-sectional end of the heat dissipation substrate 20, if the resin case 6 is fastened with two M5 screws, for example, the occurrence of a crack in the filling resin 9 was recognized under a screw torque of 3.5 Nm. This is considered to occur for the reason as follows. The absence of a tilted part at a cross-sectional end of the heat dissipation substrate 20 forms surface contact between the flat surface of the heat dissipation substrate 20 and the resin case 6, thereby causing rotation moment acting in the resin case 6 with a corner (outer periphery) of the cross-sectional end of the heat dissipation substrate 20 as a fulcrum resulting from screw fastening. The occurrence of the rotation moment in the resin case 6 deforms the resin case 6 and the filling resin 9. The filling resin 9 is generally lower in Young's modulus than the resin case 6 and does not have high strength. Thus, stress concentration is likely to occur at the filling resin 9 in a place where the resin case 6 projects by the presence of the terminal 7, for example. These are considered to be the cause for the crack in the filling resin 9.

In contrast, in the structure of the present invention, a flat surface part of the heat dissipation substrate 20 forms surface contact with the resin case 6, the tilted part is formed at a corner of a cross-sectional end of the heat dissipation substrate 20, and the heat dissipation substrate 20 is pressed against the cooling fin 10 using the pressure member 13 having the tilted part. The heat dissipation substrate 20 is pressed while the tilted part of the heat dissipation substrate 20 and the tilted part of the pressure member 13 contact at least multiple points, specifically while substantially surface contact is formed between these tilted parts. As a result, the heat dissipation substrate 20 is pressed with two surfaces of the resin case 6 and the tilted part of the pressure member 13 against the cooling fin 10. Further, rotation moment (stress) acting with the corner of the cross-sectional end of the heat dissipation substrate 20 as a fulcrum is not applied directly to the resin case 6 but it is transmitted via the pressure member 13 to the resin case 6. This reduces the rotation moment to be applied to the resin case 6 further to suppress deformation of the resin case 6 in the direction of the rotation. As a result, the occurrence of a crack in the filling resin 9 was not recognized even under a fastening torque of 3.5 Nm.

In the power module of the aforementioned structure, the heat dissipation substrate 20 is pressed against the cooling fin 10 with contact between the flat surface part of the heat dissipation substrate 20 and the resin case 6, and contact between the tilted part of the heat dissipation substrate 20 and the tilted part of the pressure member 13. In this way, the heat dissipation substrate 20 is pressed against the cooling fin 10 using two or more surfaces including the flat surface and the tilted surface of the heat dissipation substrate 20. Thus, the pressure member 13 acts to make transmission of stress to the resin case 6 unlikely, thereby suppressing bending displacement of the resin case 6 when the resin case 6 is fastened with screws to the cooling fin 10. This achieves reduction in stress to occur in the filling resin 9, so that the occurrence of a crack in the filling resin 9 can be avoided. The surface contact between the tilted parts of the heat dissipation substrate 20 and the pressure member 13 makes it possible to relax a requested dimensional tolerance and a requested position tolerance of the pressure member 13, thereby facilitating processing and assembly. Further, pressing the heat dissipation substrate 20 with the pressure member 13 not made of resin subjected to temporal change easily but made of metal resistant to temporal change can reduce temporal change of force applied to press the heat dissipation substrate 20 against the cooling fin 10. This allows the power module to have stable heat resistance for a long time.

Additionally, if the pressure member 13 is made of metal having favorable heat conductivity, heat generated in the power semiconductor element 4 can be transferred from the heat dissipation substrate 20 to the cooling fin 10 via the pressure member 13. This reduces the heat resistance of the power module to achieve the effect of extending the lifetime of the power module.

In this embodiment, the pressure member 13 is formed to extend along the entire outer periphery of the heat dissipation substrate 20. Meanwhile, the pressure member 13 is not always required to press the entire outer periphery but it may be arranged only in a place near a position where the resin case 6 is fastened with a screw so high stress is applied to the resin case 6. This can reduce the size of the pressure member 13 to bring an advantage in terms of cost.

Second Embodiment

A second embodiment differs from the first embodiment in that the bushing 11 replaces the pressure member 13 as pressure structure used in the first embodiment. Using the bushing 11 in this way still makes the bushing 11 press the tilted part formed at the heat dissipation substrate 20. This can suppress bending displacement of the resin case 6 and reduce stress to occur in the filling resin 9, so that the occurrence of a crack in the filling resin 9 can be avoided.

Figure 2:
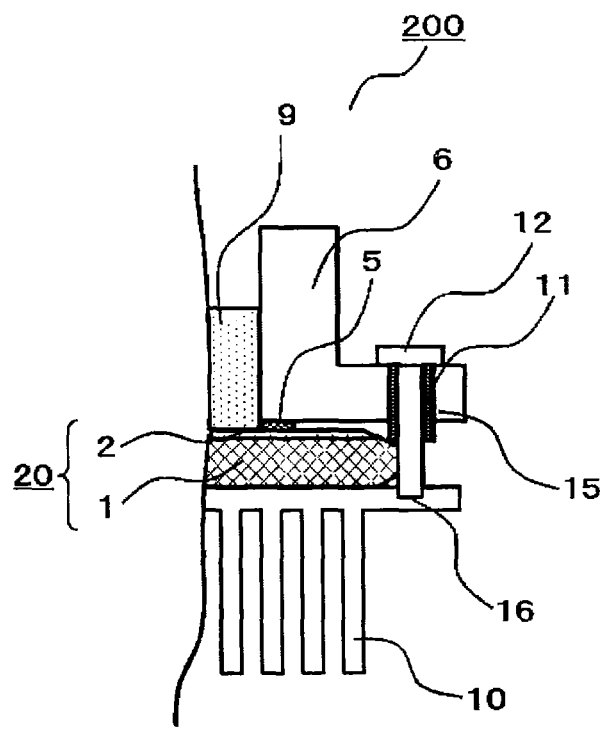
FIG. 2 is a diagrammatic view showing the cross-sectional structure of a power module of a second embodiment of the present invention.

FIG. 2 is a diagrammatic view showing the cross-sectional structure of a power module of the second embodiment of the present invention. The cross-sectional structure shown in an enlarged manner in the diagrammatic view of FIG. 2 is about a fixing part of the resin case 6 and the cooling fin 10 that forms a characteristic part of the second embodiment. As shown in FIG. 2, a module 200 includes the resin case 6, the cooling fin 10, the bushing 11, and the heat dissipation substrate 20. The resin case 6 has the passage hole 15 as a through hole formed in an outer periphery thereof. The cooling fin 10 has the screw hole 16 formed in an outer periphery thereof.

Figure 3:
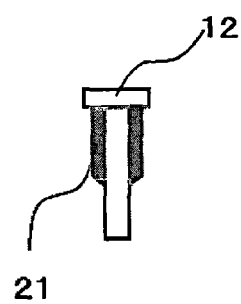
FIG. 3 is a diagrammatic view showing the cross-sectional structure of a bushing of a different shape according to the second embodiment of the present invention.

FIG. 3 is a diagrammatic view showing the cross-sectional structure of a bushing 21 of a different shape. A bushing 21 shown in FIG. 3 has a tilted part responsive to the tilted part of the heat dissipation substrate 20.

The bushing 21 is arranged in the passage hole 15 in the resin case 6. The tilted part of the heat dissipation substrate 20 is pressed with the tilted part formed at a tip portion of the bushing 21 near the cooling fin 10. The screw 12 is fastened into the screw hole 16 in the cooling fin 10 via the passage hole 15. Further, the flat surface part and the tilted part of the heat dissipation substrate 20 are pressed with the resin case 6 and the bushing 21 respectively, thereby fixing the heat dissipation substrate 20 to the cooling fin 10.

In the structure of the present invention, the occurrence of a crack in the filling resin 9 was not recognized after attachment to the cooling fin 10 with an M5 screw under a fastening torque of 3.5 Nm, for example.

Forming the bushing 11 into the shape of FIG. 3 with the tilted part increases an area of contact with the tilted part of the heat dissipation substrate 20. As a result, the heat dissipation substrate 20 can be pressed against the cooling fin 10 more stably.

In the power module of the aforementioned structure, the heat dissipation substrate 20 is pressed against the cooling fin 10 with contact between the flat surface part of the heat dissipation substrate 20 and the resin case 6, and contact between the tilted part of the heat dissipation substrate 20 and the bushing 11. In this way, the heat dissipation substrate 20 is pressed against the cooling fin 10 using two or more surfaces including the flat surface and the tilted surface of the heat dissipation substrate 20. This can suppress bending displacement of the resin case 6 when the resin case 6 is fastened with a screw to the cooling fin 10. This achieves reduction in stress to occur in the filling resin 9, so that the 25 occurrence of a crack in the filling resin 9 can be avoided. Further, omitting the process of attaching the pressure member 13 can simply manufacturing steps.

Third Embodiment

A third embodiment differs from the first embodiment in that a tilted part formed at the resin case 6 in a position facing the tilted part of the heat dissipation substrate 20 replaces the pressure member 13 as pressure structure used in the first embodiment. In this structure, the resin case 6 is formed as an integrated structure with the pressure structure. The tilted part formed at the resin case 6 is also used to press the tilted part of the heat dissipation substrate 20. This can suppress bending displacement of the resin case 6 and reduce stress to occur in the filling resin 9, so that the occurrence of a crack in the filling resin 9 can be avoided.

Figure 4:
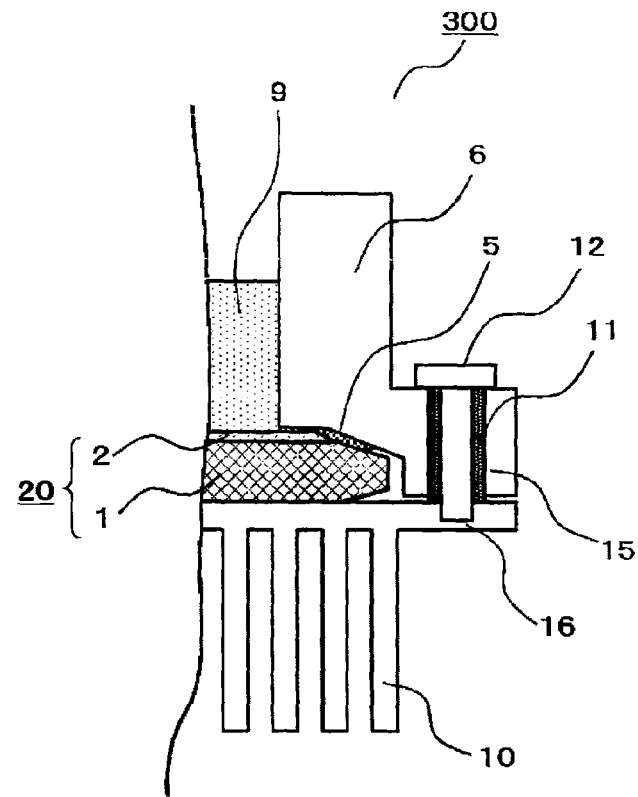
FIG. 4 is a diagrammatic view showing the cross-sectional structure of a power module of a third embodiment of the present invention.

FIG. 4 is a diagrammatic view showing the cross-sectional structure of a power module of the third embodiment of the present invention. The cross-sectional structure shown in an enlarged manner in the diagrammatic view of FIG. 4 is about a fixing part of the resin case 6 and the cooling fin 10 that forms a characteristic part of the third embodiment. As shown in FIG. 4, a power module 300 includes the resin case 6 with the tilted part, the cooling fin 10, and the heat dissipation substrate 20. The resin case 6 has the passage hole 15 as a through hole formed in an outer periphery thereof. The cooling fin 10 has the screw hole 16 formed in an outer periphery thereof.

The bushing 11 is arranged in the passage hole 15 in the resin case 6. The tilted part of the heat dissipation substrate 20 is pressed with the tilted part formed at the resin case 6. The screw 12 is fastened into the screw hole 16 in the cooling fin 10 via the passage hole 15. Further, the flat surface part and the tilted part of the heat dissipation substrate 20 are pressed with a flat surface part and the tilted part of the resin case 6 respectively, thereby fixing the heat dissipation substrate 20 to the cooling fin 10.

In the structure of the present invention, the occurrence of a crack in the filling resin 9 was not recognized after attachment to the cooling fin 10 with an M5 screw under a fastening torque of 3.5 Nm, for example.

In the power module of the aforementioned structure, the heat dissipation substrate 20 is pressed against the cooling fin 10 with contact between the flat surface part of the heat dissipation substrate 20 and the resin case 6, and contact between the tilted part of the heat dissipation substrate 20 and the tilted part of the resin case 6. In this way, the heat dissipation substrate 20 is pressed against the cooling fin 10 using two or more surfaces including the flat surface and the tilted surface of the heat dissipation substrate 20. This can suppress bending displacement of the resin case 6 when the resin case 6 is fastened with a screw to the cooling fin 10. This achieves reduction in stress to occur in the filling resin 9, so that the occurrence of a crack in the filling resin 9 can be avoided. Further, as a result of the provision of the tilted part at the resin case 6, the respective tilted parts of the resin case 6 and the heat dissipation substrate 20 are aligned with each other. This allows attachment of the resin case 6 to a position closer to the inside with respect to the heat dissipation substrate 20. This can minimize the size of an area to be used by the heat dissipation substrate 20 and reduce the usage amount of the filling resin 9. As a result, heat distortion due to a difference in a coefficient of thermal expansion among the filling resin 9, the resin case 6, and the heat dissipation substrate 20 can be reduced.

Fourth Embodiment

A fourth embodiment differs from the first embodiment in that a spring 14 provided to the resin case 6 replaces the pressure member 13 as pressure structure used in the first embodiment. The spring 14 is also used to press the tilted part formed at the heat dissipation substrate 20. This can suppress bending displacement of the resin case 6 and reduce stress to occur in the filling resin 9, so that the occurrence of a crack in the filling resin 9 can be avoided.

Figure 5:
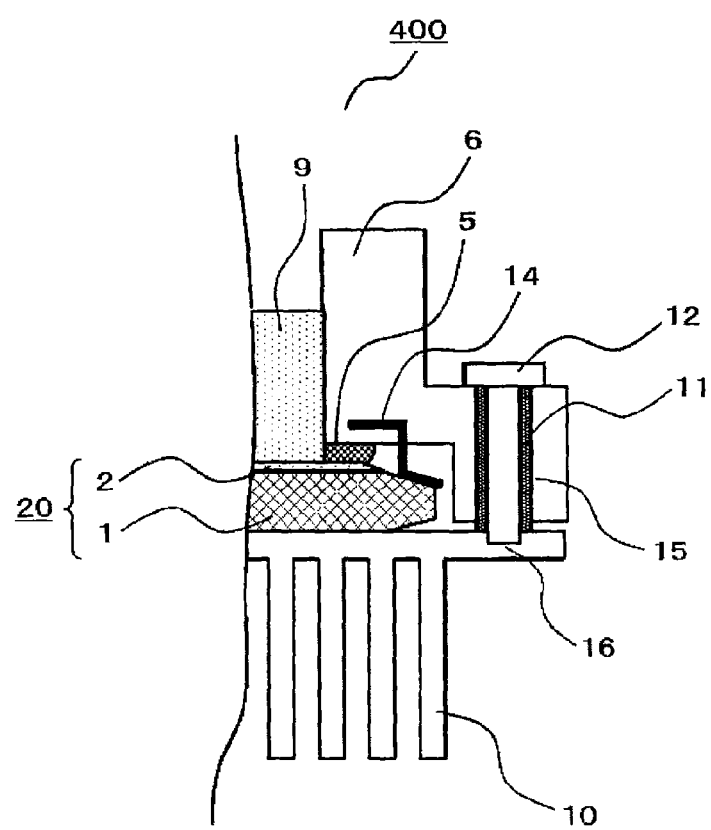
FIG. 5 is a diagrammatic view showing the cross-sectional structure of a power module of a fourth embodiment of the present invention.

FIG. 5 is a diagrammatic view showing the cross-sectional structure of a power module of the fourth embodiment of the present invention. The cross-sectional structure shown in an enlarged manner in the diagrammatic view of FIG. 5 is about a fixing part of the resin case 6 and the cooling fin 10 that forms a characteristic part of the fourth embodiment. As shown in FIG. 5, a power module 400 includes the resin case 6, the cooling fin 10, the spring 14 as pressure structure, and the heat dissipation substrate 20. The resin case 6 has the passage hole 15 as a through hole formed in an outer periphery thereof. The cooling fin 10 has the screw hole 16 formed in an outer periphery thereof.

The bushing 11 is arranged in the passage hole 15 in the resin case 6. The tilted part of the heat dissipation substrate 20 is pressed with the spring 14 provided to the resin case 6. The screw 12 is fastened into the screw hole 16 in the cooling fin 10 via the passage hole 15. Further, the flat surface part and the tilted part of the heat dissipation substrate 20 are pressed with the resin case 6 and the spring 14 of the resin case 6 respectively, thereby fixing the heat dissipation substrate 20 to the cooling fin 10. The spring 14 is formed of a metallic member. However, as long as the spring 14 can be used to press the heat dissipation substrate 20 against the cooling fin 10 and can reduce temporal change of force applied to press the heat dissipation substrate 20, the material for the spring 14 is not limited to a metallic member. It is desirable that the spring 14 provided to the resin case 6 be formed into a tilted shape responsive to the tilted part of the heat dissipation substrate 20. However, such a shape is not given as limitation but the spring 14 may be any shape that can be used to press the heat dissipation substrate 20 against the cooling fin 10.

In the structure of the present invention, the occurrence of a crack in the filling resin 9 was not recognized after attachment to the cooling fin 10 with an M5 screw under a fastening torque of 3.5 Nm, for example.

In the power module of the aforementioned structure, the heat dissipation substrate 20 is pressed against the cooling fin 10 with contact between the flat surface part of the heat dissipation substrate 20 and the resin case 6, and contact between the tilted part of the heat dissipation substrate 20 and the spring 14 provided to the resin case 6. In this way, the heat dissipation substrate 20 is pressed against the cooling fin 10 using two or more surfaces including the flat surface and the tilted surface of the heat dissipation substrate 20. This can suppress bending displacement of the resin case 6 when the resin case 6 is fastened with a screw to the cooling fin 10. This achieves reduction in stress to occur in the filling resin 9, so that the occurrence of a crack in the filling resin 9 can be avoided. Further, as a result of the provision of the spring 14 to the resin case 6, the spring 14 and the tilted part of the dissipation substrate 20 are aligned with each other. This allows attachment of the resin case 6 to a position closer to the inside with respect to the heat dissipation substrate 20. This can minimize the size of an area to be used by the heat dissipation substrate 20 and reduce the usage amount of the filling resin 9. As a result, heat distortion due to a difference in a coefficient of thermal expansion among the filling resin 9, the resin case 6, and the heat dissipation substrate 20 can be reduced. Further, using the spring 14 not made of resin subjected to temporal change easily but made of metal resistant to temporal change can reduce temporal change of force applied to press the heat dissipation substrate 20 against the cooling fin 10. This allows the power module to have stable heat resistance for a long time.

The invention claimed is:

1. A power module comprising:
   a heat dissipation substrate having one surface on which a power semiconductor element is mounted and a substrate tilted part formed at an end portion thereof;
   a resin case surrounding said power semiconductor element, the resin case contacting said one surface of said heat dissipation substrate;
   a cooling fin contacting an opposite surface of said heat dissipation substrate; and
   a pressure structure contacting said substrate tilted part of said heat dissipation substrate to press said heat dissipation substrate against said cooling fin.

2. The power module according to claim 1, wherein said pressure structure is a metallic member having a pressure structure tilted part.

3. The power module according to claim 1, wherein said pressure structure is a bushing arranged in a through hole formed in an outer periphery of said resin case.

4. The power module according to claim 3, wherein said bushing has a bushing tilted part formed in a part contacting said substrate tilted part of said heat dissipation substrate.

5. The power module according to claim 1, wherein said pressure structure is said resin case having a pressure structure tilted part formed in a position facing said substrate tilted part of said heat dissipation substrate.

6. The power module according to claim 1, wherein said pressure structure is a metal spring connected to said resin case.

7. The power module according to claim 1, wherein said substrate tilted part of said heat dissipation substrate is formed on a same side as said one surface of said heat dissipation substrate.

8. The power module according to claim 7, wherein said substrate tilted part of said heat dissipation substrate is tilted to a lower position toward an outer periphery of said heat dissipation substrate.

* * * * *